United States Patent
Zhou

(10) Patent No.: US 9,054,113 B1
(45) Date of Patent: Jun. 9, 2015

(54) BOX-IN-BOX OVERLAY MARK

(71) Applicant: NANYA TECHNOLOGY CORPORATION, Taoyuan (TW)

(72) Inventor: Jian-Ming Zhou, Boise, ID (US)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 17 days.

(21) Appl. No.: 14/142,925

(22) Filed: Dec. 30, 2013

(51) Int. Cl.
*H01L 23/544* (2006.01)

(52) U.S. Cl.
CPC .................................. *H01L 23/544* (2013.01)

(58) Field of Classification Search
CPC .............................. H01L 23/544; H01L 22/34
USPC ........................................................ 257/797
See application file for complete search history.

(56) References Cited

U.S. PATENT DOCUMENTS

| | | | |
|---|---|---|---|
| 7,952,213 B2 * | 5/2011 | Yang et al. | 257/797 |
| 2007/0246843 A1 * | 10/2007 | Yang et al. | 257/797 |
| 2008/0122124 A1 * | 5/2008 | Huang et al. | 257/797 |
| 2008/0252867 A1 * | 10/2008 | Huang | 355/40 |
| 2012/0038021 A1 * | 2/2012 | Chen et al. | 257/506 |
| 2013/0182255 A1 * | 7/2013 | Zhou et al. | 356/401 |

* cited by examiner

*Primary Examiner* — Mamadou Diallo
(74) *Attorney, Agent, or Firm* — Jianq Chyun IP Office

(57) ABSTRACT

A box-in-box overlay mark is described, including an inner box region and an outer box region surrounding the same, dense narrow trenches in the previous layer in the inner box region and the outer box region, x- and y-directional linear photoresist patterns defining a rectangle over the narrow trenches in the inner box region, and x- and y-directional linear patterns defining another rectangle in the outer box region. At least the narrow trenches in the inner box region are orientated in a direction different from the x-direction and the y-direction. The linear photoresist patterns are defined in or from a photoresist layer for defining a current layer, each of which is wider than each of the narrow trenches. The linear patterns are defined in or from the previously layer, each of which is wider than each of the narrow trenches.

9 Claims, 2 Drawing Sheets

BOX-IN-BOX OVERLAY MARK

BACKGROUND

1. Field of the Invention

The invention relates to an integrated circuit process, and particularly relates to a box-in-box (BiB) overlay mark used for overlay measurement in IC processes.

2. Description of Related Art

There are many different designs for the overlay marks for overlay measurement. A representative design is the box-in-box design, which typically includes an inner box including x- and y-directional linear patterns of the photoresist layer for defining the current layer, and an outer box including x- and y-directional linear patterns of the previous layer. The previous layer may have been defined to form trenches/openings therein or defined into line/block patterns. The photoresist layer may have been defined to form trench/opening patterns therein or defined into line/block patterns.

After the linear patterns are transferred to the substrate, followed by a metal process, defectivity concern may be raised. Hence, a design rule has been established to limit the size of largest trench that can be allowed prior to some metal process.

However, for certain processes, the design rule may become an issue. One example is how to register a chop mask to a pitch reduction layer for a DRAM word-line process. The outer box is defined by oxide spacer, but not transferred to the substrate yet. The chop layer can have photoresist on the outer box, so the outer box will never be transferred into the substrate and there is no concern for the outer box. The problem comes from the current layer (chop layer, photoresist), in which trenches have to be formed as the inner box for the overlay measurement. Limited by the lithography tool and metrology tool resolution limit, the dimension of the trenches may have to exceed the limit defined by the design rule. A solution is to add dense parallel narrow trenches in the previous layer under the inner-box photoresist patterns.

An example of such a BiB overlay mark is illustrated in FIGS. 1A to 1C, wherein FIG. 1B and FIG. 1C illustrate cross-sectional views along the line B-B' and along the line C-C' in FIG. 1A, respectively.

The overlay mark 10 includes dense parallel narrow line/trench patterns 110 in the previous layer that include alternately arranged line patterns 110a and trench patterns 110b orientated in the x- or y-direction in the entire region (inner and outer box regions), x-directional and y-directional broad trenches 112 constituting the outer box in the previous layer, and x-directional and y-directional broad trenches 122 constituting the inner box that are defined in the photoresist layer 120 defining the current layer.

However, in such a design, the two sidewalls of each inner-box trench 122 parallel with the line/trench patterns 110a/110b will possibly see different optical impacts from the line patterns 110a due to imperfect alignment, and/or snap to the nearest line patterns 110a, so that the position determination accuracy thereof is adversely affected and the overlay measurement accuracy is lowered.

SUMMARY OF THE DISCLOSURE

Accordingly, this invention provides a box-in-box (BiB) overlay mark that has a modified dense line/trench arrangement to simultaneously address the aforementioned design rule issue and improve the overlay measurement accuracy.

The BiB overlay mark of the invention includes an inner box region and an outer box region surrounding the same, dense narrow trenches in the previous layer in the inner box region and the outer box region, a plurality of x- and y-directional linear photoresist patterns defining a rectangle over the narrow trenches in the inner box region, and a plurality of x- and y-directional linear patterns defining another rectangle in the outer box region. At least the dense narrow trenches in the inner box region are orientated in a direction different from the x-direction and the y-direction. The linear photoresist patterns are defined in or from a photoresist layer defining a current layer, each of which is wider than each narrow trench. The linear patterns are defined in or from the previously layer, each of which is wider than each narrow trench.

In an embodiment, the direction in which the narrow trenches in the inner box region are orientated deviates from the x- or y-direction by an angle of 20° at least. The narrow trenches in the inner box region may be orientated in a direction of about 45° relative to the x-direction or the y-direction.

Since the dense narrow line/trench patterns of the previous layer are orientated in a direction different from the x-direction and the y-direction in the inner box region, each x- or y-directional photoresist pattern is not parallel to the dense narrow line/trench patterns in the inner box region. Therefore, the position determination of the linear photoresist patterns as the inner box is not adversely affected by the dense narrow line patterns in the inner box region, so the overlay measurement accuracy can be improved.

In order to make the aforementioned and other objects, features and advantages of this invention comprehensible, a preferred embodiment accompanied with figures is described in detail below.

DESCRIPTION OF EMBODIMENTS

This invention will be further explained with an embodiment, which is however not intended to restrict the scope of this invention. For example, though there is only one linear photoresist pattern at each edge of the inner box of the BiB overlay mark in the embodiment, there may alternatively be two or more linear photoresist patterns at each edge of the inner box if required.

Figure 1A:
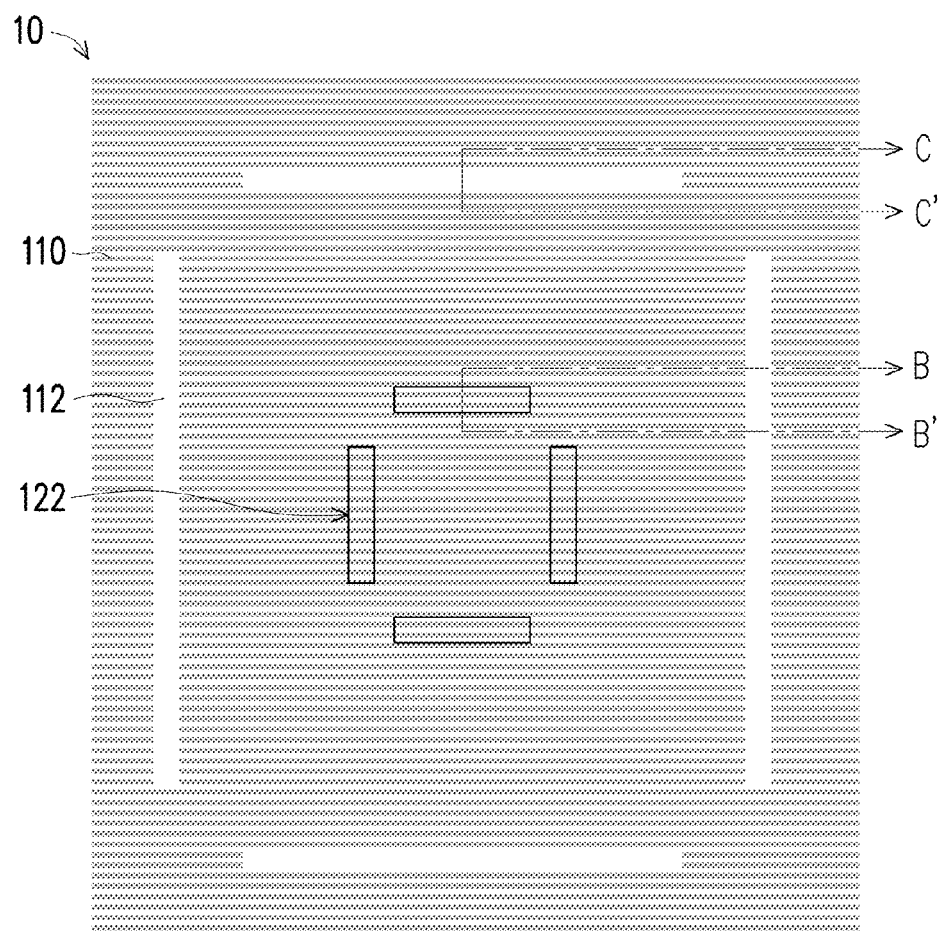
FIG. 1A illustrates the top view of a conventional BiB overlay mark.
Figure 1B:
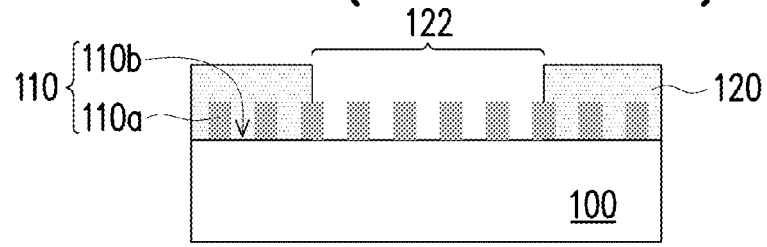
FIG. 1B and FIG. 1C illustrate cross-sectional views of the conventional BiB overlay mark in FIG. 1A along the line B-B' and along the line C-C', respectively.
Figure 1C:
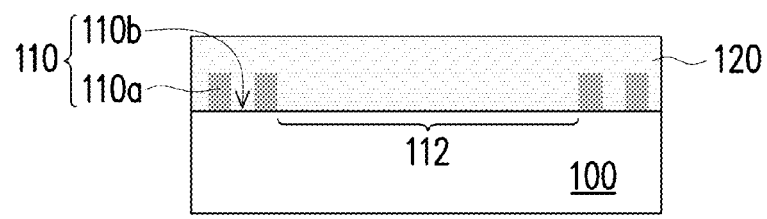
Figure 2A:
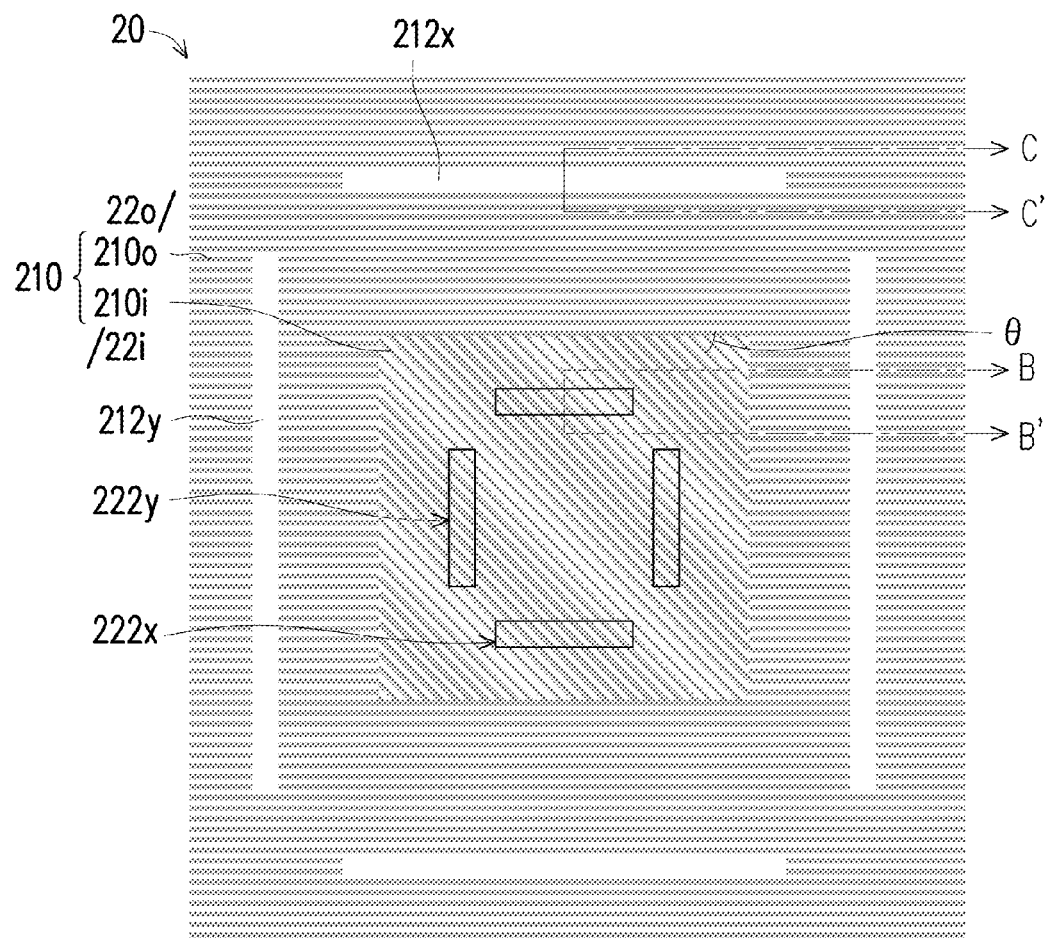
FIG. 2A illustrates a BiB overlay mark according to an embodiment of the invention.
Figure 2B:
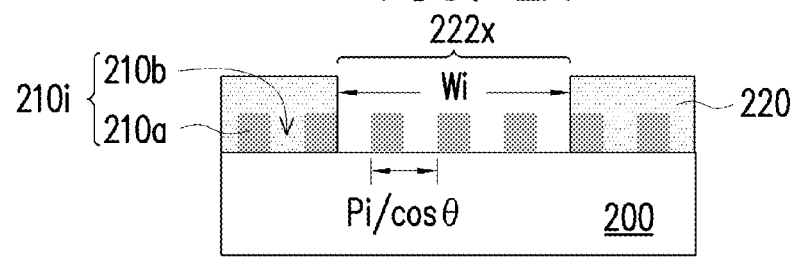
FIG. 2B and FIG. 2C illustrate cross-sectional views of the BiB overlay mark in FIG. 2A along the line B-B' and along the line C-C', respectively.
Figure 2C:
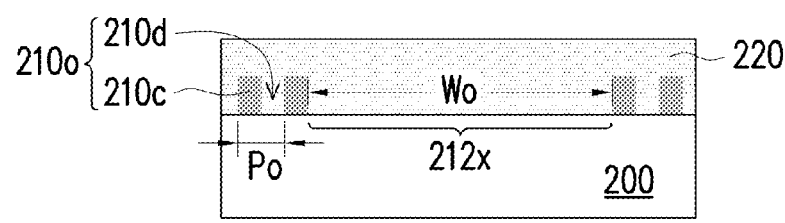

FIG. 2A illustrates a BiB overlay mark according to an embodiment of the invention. FIG. 2B and FIG. 2C illustrate cross-sectional views of the BiB overlay mark in FIG. 2A along the line B-B' and along the line C-C', respectively.

Referring to FIGS. 2A-2C, the BiB overlay mark 20 includes an inner box region 22i and an outer box region 22o surrounding the inner box region 22i, dense narrow line/trench patterns 210 of the previous layer in the inner box region 22i and the outer box region 22o, two x-directional trenches 222x and two y-directional trenches 222y defining a rectangle over the dense narrow line/trench patterns 210i in the inner box region 22i, and two x-directional trenches 212x and two y-directional trenches 212y defining another rectangle in the outer box region 22o. At least the dense narrow line/trench patterns 210*i* in the inner box region 22*i* are orientated in a direction different from the x-direction and the y-direction. The angle between the orientation direction of 210*i* and the x-direction is referred to as "θ" in the figure. The trenches 222*x* and 222*y* are defined from a photoresist layer 220 defining the current layer, each of which is wider than each of the dense narrow line/trench patterns 210*i*. The trenches 212*x* and 212*y* are defined in the previously layer, each of which is wider than each of the dense narrow line/trench patterns 210*o*.

The dense narrow line/trench patterns 210*i* in the inner box region 22*i* include narrow line patterns 210*a* and narrow trench patterns 210*b* that are arranged alternately. The dense narrow line/trench patterns 210*o* in the outer box region 22*o* include narrow line patterns 210*c* and narrow trench patterns 210*d* that are arranged alternately. The dimension of the dense narrow line/trench patterns 210*i* in the inner box region 22*i* is only limited by the previous layer process, and it does not have to match the dimension of 210*o*. Especially with the orientation difference, most likely the x- or y-directional dimension of 210*i* is different from that of 210*o*.

In a preferred embodiment, the orientation direction of the dense narrow line/trench patterns 210*i* in the inner box region 22*i* deviates from the x- or y-direction by an angle of 20° at least. The orientation direction may be about 45° (θ=45°) relative to the x- or y-direction, as shown in FIG. 2A.

The dense narrow line/trench patterns 210*o* in the outer box region 22*o* may be orientated in any direction, but usually in the x- or y-direction to match the real features in the device areas.

In an exemplary embodiment, each of the dense narrow line/trench patterns 210*a*/210*b* and 210*c*/210*d* has a width within the range of 30 to 100 nm. Accordingly, the dense narrow line patterns 210*a* or 210*c* have a pitch Pi of 60 to 200 nm along its perpendicular direction, and the dense narrow trenches 210*b* or 210*d* have a pitch Po of 60 to 200 nm along its perpendicular direction. In addition, each of the trenches 222*x* and 222*y* in the inner box region 22*i* has a width Wi within the range of 100 to 1000 nm, and each of the trenches 212*x* and 212*y* in the outer box region 22*o* has a width Wo within the range of 100 to 1000 nm.

In addition, though the x- and y-directional linear photoresist patterns in the above embodiment are trenches (222*x* and 222*y*) defined in the photoresist layer (220) defining the current layer, they may alternatively be broad solid line patterns formed from the photoresist layer defining the current layer, with a proviso that the photoresist layer covers the outer box patterns.

On the other hand, though the x- and y-directional linear patterns in the outer box region 22*o* in the above embodiment are trench patterns formed in the previous layer, they may alternatively include solid line patterns defined from the previous layer.

Since the dense narrow line/trench patterns of the previous layer are orientated in a direction different from the x-direction and y-direction in the inner box region, each x- or y-directional photoresist bar is not parallel with the narrow line/trench patterns in the inner box region. Therefore, the position determination of the photoresist bars as the inner box is not adversely affected by the dense narrow line patterns in the inner box region, so the overlay measurement accuracy can be improved.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A box-in-box overlay mark, comprising
   an inner box region and an outer box region surrounding the inner box region;
   dense narrow trenches in a previous layer in the inner box region and the outer box region, wherein at least the dense narrow trenches in the inner box region are orientated in a direction different from an x- or y-direction;
   a plurality of x-directional and y-directional linear photoresist patterns defining a rectangle over the dense narrow trenches in the inner box region, wherein the linear photoresist patterns are defined in or from a photoresist layer for defining a current layer, and each of the linear photoresist pattern is wider than each of the dense narrow trenches; and
   a plurality of x-directional and y-directional linear patterns defining another rectangle in the outer box region, wherein the linear patterns are defined in or from the previously layer, and each of the linear patterns is wider than each of the dense narrow trenches.

2. The box-in-box overlay mark of claim 1, wherein the direction in which the narrow trenches in the inner box region are orientated deviates from the x- or y-direction by an angle of 20° at least.

3. The box-in-box overlay mark of claim 2, wherein the narrow trenches in the inner box region are orientated in a direction of about 45° relative to the x- or y-direction.

4. The box-in-box overlay mark of claim 1, wherein the dense narrow trenches in the outer box region are also orientated in the direction in which the dense narrow trenches in the inner box region are orientated.

5. The box-in-box overlay mark of claim 1, wherein each of the dense narrow trenches has a width within a range of 30 to 100 nm, each of the linear photoresist patterns has a width within a range of 100 to 1000 nm, and each of the linear patterns in the outer box region has a width within a range of 100 to 1000 nm.

6. The box-in-box overlay mark of claim 1, wherein the linear photoresist patterns in the inner box region are trench patterns defined in the photoresist layer for defining the current layer.

7. The box-in-box overlay mark of claim 1, wherein the linear photoresist patterns in the inner box region are photoresist bars defined from the photoresist layer for defining the current layer.

8. The box-in-box overlay mark of claim 1, wherein the linear patterns in the outer box region are trenches defined in the previous layer.

9. The box-in-box overlay mark of claim 1, wherein the linear patterns in the outer box region comprise solid line patterns defined from the previous layer.

\* \* \* \* \*